United States Patent [19]

Yamashita

[11] 4,071,786
[45] Jan. 31, 1978

[54] THICKNESS-SHEAR CRYSTAL VIBRATOR

[75] Inventor: Shiro Yamashita, Tokyo, Japan

[73] Assignee: Kabushiki Kaisha Daini Seikosha, Japan

[21] Appl. No.: 672,460

[22] Filed: Mar. 31, 1976

[30] Foreign Application Priority Data

Apr. 8, 1975  Japan ............................... 50-47196[U]

[51] Int. Cl.² ........................................... H01L 41/04
[52] U.S. Cl. ................................................... 310/361
[58] Field of Search ...................... 310/8, 8.5, 8.6, 9.5, 310/9.6

[56] References Cited

U.S. PATENT DOCUMENTS

| | | | |
|---|---|---|---|
| 2,443,700 | 6/1948 | Sylvester et al. | 310/9.6 X |
| 2,505,121 | 4/1950 | Knights | 310/9.6 X |
| 2,626,363 | 1/1953 | Holmbeck | 310/9.6 |
| 2,677,064 | 4/1954 | Hill | 310/9.6 X |
| 2,699,508 | 1/1955 | Fastenau, Jr. | 310/9.6 X |
| 2,856,549 | 10/1958 | Hunt | 310/9.6 |
| 3,831,043 | 8/1974 | Hoffmann et al. | 310/9.6 X |

Primary Examiner—Mark O. Budd
Attorney, Agent, or Firm—Robert E. Burns; Emmanuel J. Lobato; Bruce L. Adams

[57] ABSTRACT

A thickness-shear crystal vibrator having a pair of driving electrodes on a pair of opposed planar surfaces. A pair of side surfaces adjacent the opposed surfaces has a pair of electrode leads disposed thereon which extend from the driving electrodes to the thickness center line or shear vibration modal line of the vibrator. The electrode leads are formed to extend over a bevel cut at the edge portion of the opposed side planar surfaces and ends of the electrode leads are both connected to a respective conductive supporting member.

4 Claims, 12 Drawing Figures

THICKNESS-SHEAR CRYSTAL VIBRATOR

BACKGROUND OF THE INVENTION

This invention relates to a thickness-shear crystal vibrator having improved vibration characteristics.

An AT-cut quartz vibrator is a typical vibrator which has been conventionally known as the thickness-shear crystal vibrator. The AT-cut quartz vibrator has various forms, such as rectangular, circular and bar. Generally, as shown in FIG. 1 (a) and (b), Y axis designates an axis perpendicular to an X axis (an electrical axis) and Z axis (a light axis) of a quartz crystal, wherein it comprises a pair of cut planes (Y' planes) which partially meet at right angles with the Y axis rotated a fixed angles θ (about 35°) around the X axis as a center (Y' axis). The AT-cut quartz vibrator 1 produces a thickness-shear strain and generates a principal vibration of a thickness-shear vibration within a prescribed frequency when an electric field is applied through driving electrodes 2 formed at a pair of the Y' plane above mentioned. Moreover, a contour vibration by way of a spurious vibration which vibrates with a frequency other than the said frequency is also generated according to the form and the dimensions of the vibrator.

The distribution of the principal vibration of the AT-cut quartz vibrator effected by the thickness-shear strain is ideally maximum at the center portion of Y' planes measured along the X axis as shown in FIG. 1 (c) and (d), and gradually decreases toward the periphery of the Y' planes, and finally as arrows in FIG. 1 (a) indicate, theoretically becoming zero at a thickness center line (a center axis line or nodal line) 3, which meets at right angles with the Y' axis and which is defined by lines of intersection of a nodal plane of vibration intersecting side surfaces of the vibrator. While as FIG. 1 (c) shows, the distribution of the thickness-shear strain is uniform in a direction of the Z' axis of the AT-cut quartz vibrator 1.

Conventionally it has been proposed to miniaturize an AT-cut quartz vibrator by diminishing the width in a direction of the Z' axis. FIG. 2 (a) shows an embodiment, wherein a driving electrode 5 is disposed in the Y' plane of an AT-cut quartz vibrator 4. On the occasion of extending the lead wire from the driving electrode 5 to connect an external electric circuit, the vibration of the AT-cut quartz vibrator 4 should not be disturbed as fas as possible. As shown in FIG. 2(a) an electrode lead 6' extends along the vibrator surface from the side of the driving electrode 5, and a lead portion 6a to connect to the external circuit is connected to the circuit by means of wire bonding method or supporting members which function as a lead wire. However, since the electrode lead 6' is formed along the surface which vibrates with greater amplitude than the center line and adjacent areas, the friction with the vibrator is so great as to be influential in ageing. Therefore, on the occasion the end 6a' is supported, it is disadvantageous because the dissipation caused by supporting, characteristic dispersion and influences on the frequency ageing is increased. These disadvantages becomee more serious practically when the miniaturized vibrator is used for a portable watch or the like, since the relative dimension of supporting members and lead wire in relation to the vibrator are enlarged.

As an improvement, a method as shown in FIG. 2 (b) is proposed, wherein an electrode lead 6 extends from the said driving electrode 5 to the side surface or plane adjacent to the Y' plane along a thickness center line (nodal line or thickness center axis line) 7 defined by the intersection of the vibration nodal plane with the side plane. By forming the electrode lead 6 at the thickness center line 7 of the side plane as shown in FIG. 2 (b), most of the electrode lead is located at the portion where a vibration caused by the strain of the AT-cut quartz vibrator 4 is hard to be conveyed to the lead, wherefore an obstruction to the principal vibration effected by the said electrode lead 6 is not serious, and as a result, a decline of temperature-characteristics, Q factor (a sharpness of resonance) and increase in frequency ageing can be prevented.

However in the AT-cut quartz vibrator 4, the Y' plane, whereat the driving electrode 5 is formed, and the XY' plane, and its adjacent side plane (a plane partially meeting at right angles with the Z' axis and which comprises the X axis and Y' axis, which hereinafter indicated as the Z' plane) meet approximately at right angles, wherefore it is difficult to form the said electrode lead at the edge portion (the adjacent portion) of the Y' plane and Z' plane on the occasion that the electrode lead 6 extends from the said Y' plane to the Z' plane by means of the former metallic film formed by measures such as evaporation and sputtering. As a result, the metallic film to be the electrode lead 6 is hard to adhere to the edge portion of the Y' plane and Z' plane strongly enough to get a high reliability, wherefore unfavorable phenomena result such as increase in electric resistance of the electrode lead 6, and poor connection mechanical results, and efficiency percentage is not good. Therefore, in order to obtain a high reliability, it is required to enlarge the width and the thickness of the electrode lead 6 to help the metalic film to be fully adhered to the edge portion of the said Y' plane and the Z' plane. However, on the occasion that the width and the thickness of the electrode lead 6 is enlarged too much, the friction dissipation of the AT-cut quartz vibrator 4 and the electrode lead 6 increases and internal strain within the electrode lead 6 increases, wherefore an increase in crystal impedance ( CI ), a fall in driving efficiency and an increase in frequency ageing are brought about so as to degenerate the vibration-characteristics.

SUMMARY OF THE INVENTION

Accordingly, it is an object of the present invention to provide an improved thickness-shear crystal vibrator which has a prefered vibration-characteristics such as elimination of dissipation and frequency ageing by forming an electrode lead extended from a driving electrode of the thickness-shear crystal vibrator with uniformed width and thickness over nodal region of the vibrator.

BRIEF DESCRIPTION OF THE DRAWINGS

FIG. 1c illustrates the amplitude distribution of the thickness-shear vibrations of the body shown in FIG. 1a;

FIG. 4 is a cross-sectional view of the vibrator according to the present invention as shown in FIG. 3a;

DESCRIPTION OF THE PREFERRED EMBODIMENTS

The present invention will be fully described in connection with the accompanying drawings.

Figure 1A:
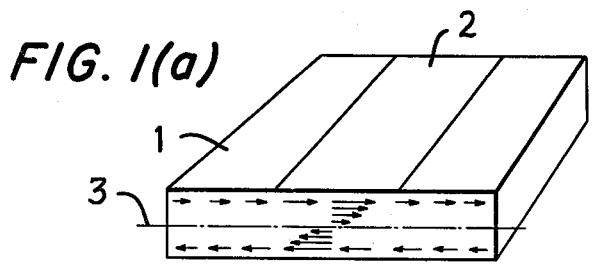
FIG. 1a illustrates a body having internal thickness-shear vibrations.
Figure 1B:
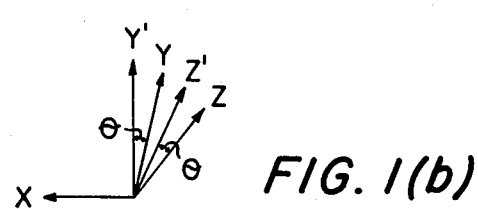
FIG. 1b illustrates a crystal axis coordinate system.
Figure 1C:
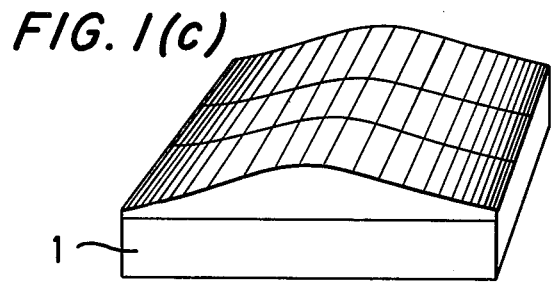
Figure 1D:
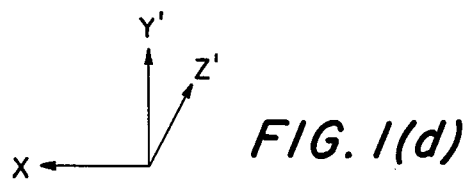
FIG. 1d illustrates a crystal axis coordinate system.
Figure 2A:
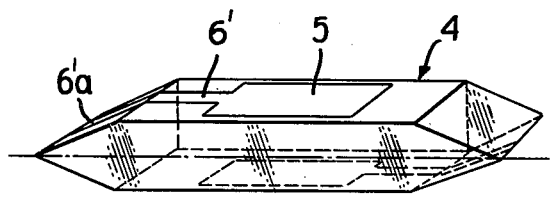
FIG. 2a illustrates a AT-cut quartz vibrator which operates in a thickness-shear vibration mode.
Figure 2B:
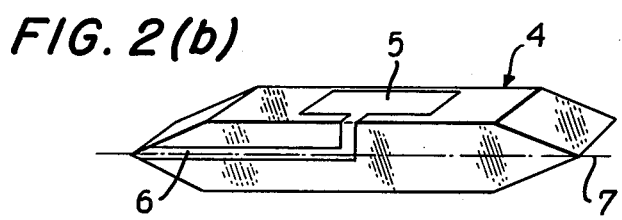
FIG. 2b illustrates another AT-cut quartz vibrator having a different electrode lead structure.
Figure 2C:
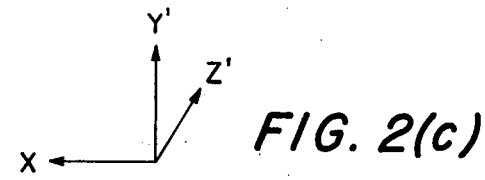
FIG. 2c illustrates a crystal axis coordinate system.
Figure 3A:
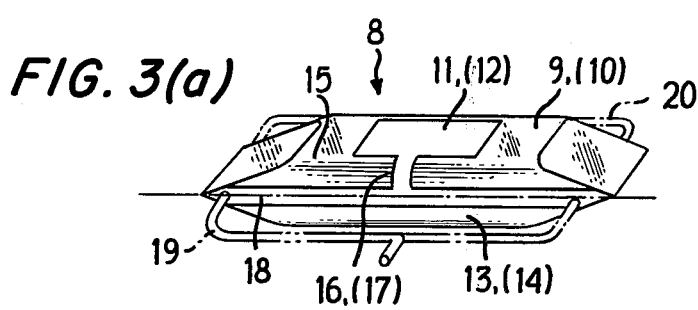
FIG. 3a illustrates an embodiment of the thickness-shear crystal vibrator according to the present invention.
Figure 3B:
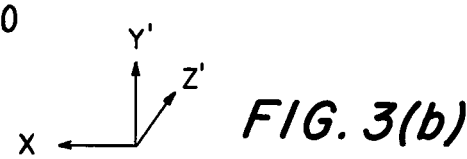
FIG. 3b illustrates a crystal axis coordinate system.
Figure 4:
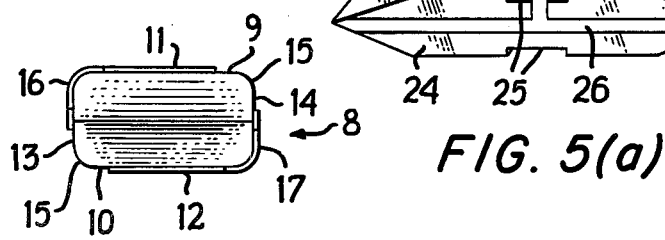

FIG. 3 and FIG. 4 are embodiments of a thickness-shear crystal vibrator of the present invention, wherein 8 indicates an AT-cut quartz vibrator which operates as a thickness-shear crystal vibrator. The AT-cut quartz vibrator 8 consists of a pair of planes 9, 10, which partially meet at right angles with the Y' axis and driving electrodes 11, 12 are formed on planes 9 and 10, respectively. A pair of side planes 13, 14, which partially meet at right angles with a quartz crystal Z' axis are adjacent to the side planes 9, 10. Both ends of the above-mentioned planes 9, 10 are in a taper configuration. The edge portion of the said planes 9, 10 and its adjacent side planes 13, 14 are formed at a cutting bevel 15 which is rounded off circularly. Electrode leads 16, 17 extended from the driving electrodes 11, 12 are formed at the adjacent portion of a thickness center line 18 of the side planes 13, 14 by way of the cutting bevel 15, along the center line 18.

As mentioned so far, the electrode leads 16, 17 are formed at the rounded off cutting bevel 15; in other words, they are not formed at the edge portion where two planes meet at right angles, and therefore the electrode leads 16, 17 can be formed in the prescribed thickness and width prefered for high reliability by means of evaporation and the like.

Both ends of the electrode leads 16, 17 are extended from the center portion of the AT-cut quartz vibrator to the thickness center line 18 and its adjacent portion along the center line 18. As shown in FIG. 3, supporting members 19, 20 each consist of an electric conductor and are connected to the both ends of the vibrator 8 in order to support the AT-cut quartz vibrator 8. The supporting members 19, 20 are respectively connected to the electrode leads 16, 17 electrically as well as to support the vibrator body.

Thus, when the AT-cut quartz vibrator 8 is supported and the voltage to vibrate the vibrator 8 is applied by way of the said supporting members 19, 20, the electric current is applied to the driving electrodes 11, 12 by way of the electrode leads 16, 17 extended to the both ends of the vibrator 8.

Namely, it is apparent from the construction of the supporting members 19, 20, and that of the electrode leads 16, 17, that the electrode lead 16 extended to the thickness center line 18 is connected in parallel by the branched portion of the supporting member 19, wherefore the electric resistance value of the electrode lead portion is diminished to about one-half of the value if the electrode lead 6 were to be extended to only one side. Accordingly, it is possible to decrease the width and the thickness of the electrode lead 16 to less than the width and thickness of the former type, wherefore the friction dissipation of the vibrator 8 and the electrode lead 16 can be diminished so as to improve the vibration characteristics, such as frequency ageing and the like. Moreover, on the occasion that both ends of the electrode leads 16, 17 are connected with the both ends of the conductive supporting members 19, 20, respectively by means of a bonding method as above mentioned, the reliability of connection is enhanced because they are connected at two points.

Figure 5B:
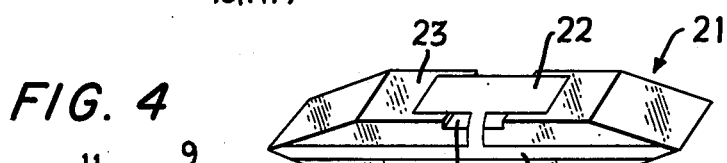
FIG. 5b illustrates a crystal axis coordinate.
Figure 5A:
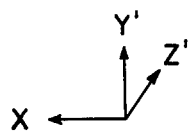
FIG. 5a illustrates another embodiment of the thickness-shear vibrator according to the present invention.

FIG. 5 shows another embodiment of the thickness-shear crystal vibrator in accordance with this invention, wherein a difference between it and the above-described embodiment is that the cutting bevel is planar. An At-cut quartz vibrator 21, operated as thickness-shear crystal vibrator, is formed almost similar to the above-described embodiment, but includes an oblique planar cutting bevel 25 formed at the edge portion of a bevel 23 where a driving electrode 22 is formed, and its adjacent plane 24. Due to the formation of the said oblique cutting bevel 25, the bevel 23 and the side plane connect with at obtuse angle by way of the cutting bevel 25. Therefore, an electrode lead 26, which is extended from the driving electrode 22 to the side plane 24 by way of the cutting bevel 25, can be in the prescribed thickness and width with full reliability without such defects as follows; the metalic film becoming thinner at the edge portion of the plane 23 and the side plane 24, and the thickness and the width increasing. However, a form of the cutting bevel is not restricted to the forms described and can be polygonal, for example. While a thickness-shear crystal vibrator is not limited to the said AT-cut quartz vibrator comprising tantalic acid lithium and niobic acid lithium these are satisfactory materials, and the form is also not restricted in the form shown in FIGS. Further, the electrode leads extended from the driving electrodes do not necessarily have to extend to the both ends from the center portion of the vibrator's side plane and it is possible to extend the electrode leads to one side.

As mentioned above, accoring to the present invention, a thickness-shear crystal vibrator comprises a cutting bevel or bevel cut formed at the edge portion of adjacent planar surfaces and an electrode lead extends by way of the cutting bevel between the adjacent surfaces. Therefore, it is possible to form the electrode lead in a prescribed width and thickness instead of forming it partially thinner than usual, and moreover, it is possible to reduce the electric resistance of the electrode lead to decrease frequency ageing and dissipation, and the vibrator Q factor is raised and prefered vibration-characteristics can be obtained. Consequently, by means of the present invention, practical efficiency can be obtained.

I claim:

1. In a thickness-shear mode crystal vibrator including a pair of opposed planar surfaces having a pair of driving electrodes each formed on a respective one of said opposed planar surfaces, a pair of side planar surfaces adjacent to said planar surfaces on which said driving electrodes are formed, a pair of electrode leads which extend from said driving electrodes to the thickness center line or an adjacent area of the side planar surfaces, and a respective conductive supporting member connected with each of said electrode leads, the improvement wherein the crystal electrical X axis extends in the length direction of said side and opposed planar surfaces, a bevel cut is formed at the edge portion of said opposed planar surfaces where said driving electrode leads are formed and the adjacent side planar surfaces, said electrode leads are formed to extend from said opposed planar surfaces to the respective side planar surface over the respective bevel cuts therebetween and to extend along a major portion of the length of said side planar surfaces in the direction of the X axis and along the thickness center line of said side planar surface at the nodal plane of vibration, and said conductive supporting members are dimensioned to connect with the respective electrode leads at opposite ends of the respective electrode leads.

2. An AT cut thickness-shear mode crystal vibrator, comprising: a crystal body having an upper planar surface and an opposed lower planar surface and a pair of opposed planar side surfaces, and said crystal body having an electrical X axis oriented along a length of said crystal body extending generally parallel to said upper and lower and side surfaces and extending in the length direction of said side surfaces, and at least a pair of beveled edge portions respectively connecting and merging said upper surface with one of said side surfaces having the length thereof in the direction of the X axis and said lower surface with the other of said side surfaces having the length thereof in the direction of the X axis; a pair of electrodes each disposed on a respective one of said upper and lower surfaces for receiving electrical signals to develop within said crystal body shear vibrations distributed about a nodal plane between said upper and lower surfaces and intersecting each of said side surfaces at a nodal line extending along a length of the respective side surface; a pair of conductive electrode leads disposed on said crystal body and each extending from a respective one of said electrodes over the respective beveled edge portion adjacent the surface on which the respective electrode is disposed and onto the one of said side surfaces having the length thereof in the direction of the X axis with which is merges wherein the portion of said electrode leads disposed on a side surface is disposed in a narrow strip along the nodal line of the side surface in the direction of the X axis and extends over a major portion of the length of the side surface and terminates at a pair of ends; and a pair of conductive supports each connected with a respective one of said electrode leads at the opposite ends of the respective electrode leads for supporting the crystal body having said electrodes and said electrode leads mounted thereon and for applying electrical signals to said electrodes to develop shear vibrations within said crystal body except at said nodal plane whereby said electrode leads are substantially not subjected to shear vibrations.

3. In a thickness-shear crystal vibrator according to claim 1, wherein said electrode leads have a substantially uniform thickness.

4. In a thickness-shear crystal vibrator according to claim 2, wherein said electrode leads have a substantially uniform thickness.

* * * * *